United States Patent [19]

Brandenberg et al.

[11] Patent Number: 4,810,989

[45] Date of Patent: Mar. 7, 1989

[54] TRANSFORMER SYSTEM FOR MEASURING ELECTRICAL CURRENT

[75] Inventors: Urs Brandenberg; Thomas Seitz, both of Zug, Switzerland

[73] Assignee: LGZ Landis & Gyr Zug, Zug, Switzerland

[21] Appl. No.: 87,100

[22] Filed: Aug. 19, 1987

[30] Foreign Application Priority Data

Sep. 29, 1986 [CH] Switzerland .................. 03899/86

[51] Int. Cl.$^4$ .................. H01F 15/04; H01F 27/28
[52] U.S. Cl. .................. 336/84 M; 324/127;
336/175; 336/223; 336/225
[58] Field of Search .................. 324/127, 117 R, 142;
336/96, 84 R, 84 M, 223, 173, 175, 205, 181

[56] References Cited

U.S. PATENT DOCUMENTS

| | | | |
|---|---|---|---|
| 4,189,618 | 2/1980 | Bretts et al. | 336/84 M X |
| 4,258,347 | 3/1981 | Konig | 336/96 X |
| 4,473,810 | 9/1984 | Sougues et al. | 336/84 M X |
| 4,506,214 | 3/1985 | Lienhard et al. | 324/127 X |
| 4,513,273 | 4/1985 | Friedl | 324/127 X |
| 4,559,495 | 12/1985 | Lienhard | 324/127 X |
| 4,742,296 | 5/1988 | Petr et al. | 324/117 R |

FOREIGN PATENT DOCUMENTS 1079192 7/1960 Fed. Rep. of Germany .

Primary Examiner—Thomas J. Kozma
Attorney, Agent, or Firm—Marmorek, Guttman & Rubenstein

[57] ABSTRACT

A transformer system for measuring electrical current includes an electrical conductor having first and second conductor portions. The first conductor portion conducts electrical current in one direction and the second conductor portion conducts the electrical current in an opposite direction. The first conductor portion produces a magnetic field $\vec{H}_a$ and the second conductor portion produces a magnetic field $\vec{H}_b$. A coil having a non-ferromagnetic core is positioned between the first and second conductor portions so that the axis of the coil is substantially parallel to the magnetic fields $\vec{H}_a$ and $\vec{H}_b$. The separation between the outer circumferential surface of the coil and the first and second conductor portions is the minimum distance for avoiding a voltage breakdown therebetween for a predetermined maximum electrical current in the conductor portions. At least one ferromagnetic shield surrounds the first and second conductor portions for shielding the coil from external magnetic fields.

19 Claims, 3 Drawing Sheets

TRANSFORMER SYSTEM FOR MEASURING ELECTRICAL CURRENT

FIELD OF THE INVENTION

The invention relates to a transformer system, and particularly, to a transformer system suitable for use in an electrical meter for measuring the electrical current flowing in an electrical conductor.

BACKGROUND OF THE INVENTION

Transformer systems of the type considered herein have many uses and applications. One use is in electrical meters for measuring instantaneous electrical power delivered to a consumer. In this case, the instantaneous value of the electrical current is measured using a suitable circuit arrangement and is multiplied by the instantaneous value of the supply voltage. Transformer systems are known and one arrangement has been disclosed in DE-AS 1,079,192.

SUMMARY OF THE INVENTION

It is an object of the invention to provide a transformer system suitable for use in an electrical meter for measuring electrical current. The transformer system is simple and has non-critical mechanical tolerances. In addition, the transformer system is relatively insensitive to potentially interfering external magnetic fields and enables a strong output signal which is precise and reliable.

In one embodiment, the transformer system includes an electrical conductor having two conductor portions. An electrical current in the electrical conductor moves in one direction in one conductor portion and in the opposite direction in the other conductor portion. When an electrical current is in the electrical conductor, one conductor portion produces a magnetic field $\vec{H_a}$ and the other conductor portion produces a magnetic field $\vec{H_b}$. A wire wound coil having a non-ferromagnetic core is positioned between the two portions of the electrical conductor so that the axis of the coil is substantially parallel to the magnetic fields $\vec{H_a}$ and $\vec{H_b}$.

In addition, the separation between the outer circumferential surface of the coil and the two conductor portions of the electrical conductor is made the minimum distance for avoiding a voltage breakdown therebetween. A ferromagnetic shield is arranged to surround the two conductor portions of the electrical conductor to provide shielding from external magnetic fields.

The transformer system according to the invention has a relatively simple construction suitable for commercial production and also provides a strong output signal. The transformer system is relatively insensitive to external magnetic fields.

BRIEF DESCRIPTION OF THE DRAWINGS

Examples of embodiments according to the invention are described herein in further detail in connection with the drawings in which.

Identical reference numerals designate identical parts in all figures of the drawings.

DESCRIPTION OF THE INVENTION

Figure 1:
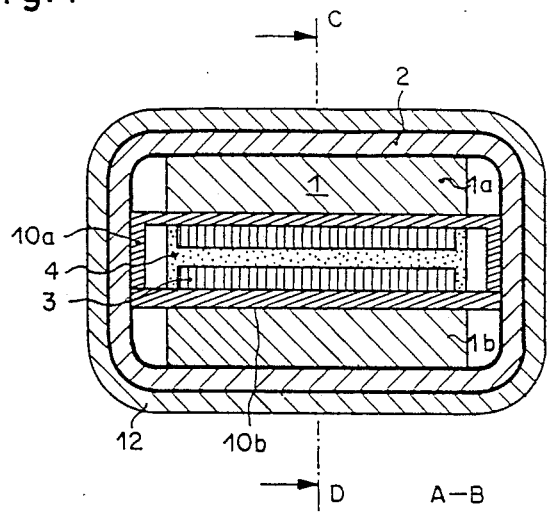
FIG. 1 is a cross sectional view of a first embodiment of the invention taken along line A-B of FIG. 2.
Figure 2:
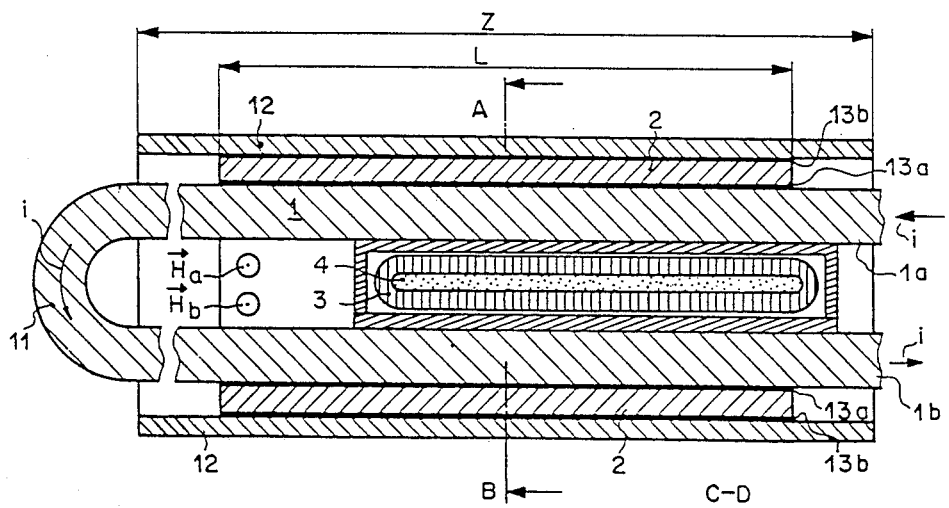
FIG. 2 is a cross sectional view of the first embodiment of the invention taken along the line C-D of FIG. 1.

Referring to FIGS. 1 and 2, the transformer system shown is used to measure the electrical current i flowing in an electrical conductor 1. The electrical conductor 1 has two conductor portions 1a and 1b. As shown in FIG. 2, the electrical current i enters the conductor portion 1a and exits in a generally opposite direction through the conductor portion 1b. At least one ferromagnetic shield 2 surrounds the conductor portions 1a and 1b to provide protection against the adverse influences of external magnetic fields.

At least one coil 3 is located between the conductor portions 1a and 1b. The coil 3 is wound on a coil body 4 which is non-ferromagnetic. The coil body 4 can be air. Generally, the coil 3 is a wire wound coil and preferably relatively flat as shown in FIG. 2. The electrical current i flowing in the conductor portions 1a and 1b generates magnetic fields $\vec{H_a}$ and $\vec{H_b}$, respectively. The coil 3 is arranged so that the axis of the coil 3 is substantially parallel to the magnetic fields $\vec{H_a}$ and $\vec{H_b}$.

The distance between the circumferential surface of the coil 3 and the conductor portions 1a and 1b of the electrical conductor 1 is made to be substantially equal to the minimum distance required to avoid voltage breakdown for a predetermined maximum electrical current in the current portions. Typically, the distance is at most 1 millimeter. This spacing results in the magnetic coupling between the electrical conductor 1 and the coil 3 being substantially the largest possible amount without creating a hazard of voltage breakdown.

The coil 3 is preferably located in a housing 10 made of electrically insulating material to provide electrical insulation for the coil 3 with respect to the conductor portions 1a and 1b. Preferably, the housing 10 is made from a ceramic material and includes a bottom portion 10a and a housing cover 10b. The coil 3 can be located on a carrier made of an electrically insulating material o which additional electrical structural elements are also located. The bottom 10a of the housing 10 can be this carrier.

The ferromagnetic shield 2 is preferably made of material having a high permeability such as an iron-nickel alloy. Suitable iron-nickel alloys are available commercially under the trade names of PERMENORM, VACOPERM, TRAFOPERM, PERMAX, ULTRAPERM, and NU-METAL. The ferromagnetic shield 2 is preferably in the shape of a cylinder and can be made from at least one piece of sheet metal bent into the shape of a cylinder. This mechanical structure for the ferromagnetic shield 2 greatly simplifies its fabrication. The length "L" of the ferromagnetic shield 2 as shown in FIG. 2 is greater than the greatest dimension of the open ends of the cylinder so that the ferromagnetic shield 2 is highly effective in shielding the coil 3 from external magnetic fields.

The conductor portions 1a and 1b can have rectangular cross sections and in such a case, it is preferable for the ferromagnetic shield 2 to also have a rectangular cross section. In one embodiment, the conductor portions 1a and 1b are part of a U-shaped loop 11 and parallel to each other. Typically, the rectangular cross section of the conductor portions 1a and 1b can be 2 mm by 10 mm for a current i of about 100 Amps. As indicated above, additional structural elements (not shown) such as the wiring electronics of the transformer system can be installed on a carrier either inside or outside the housing 10.

In FIG. 1, the width of the housing 10 is shown as being greater than the width of the conductor portions 1a and 1b. In that case, the cross section taken along line A-B of the housing 10 would completely fill the space between the portions 1a and 1b of the electrical conductor 1 and the bend of the U-shaped loop 11. The width of the housing 10, however, can also be equal to or smaller than the width of the conductor portions 1a and 1b. In this case, the cross section taken along line A-B of the housing 10 fills the space between the conductor portions 1a and 1b only partially. The conductor portions 1a and 1b can cross the space between the housing 10 and the ferromagnetic shield 2 in such a manner that they are in physical contact with the housing 10 and electrically insulated from the ferromagnetic shield 2. Between the ferromagnetic shield 2 and the conductor portions 1a and 1b there are electrically insulating layers 13a.

The ferromagnetic shield 2 can be completely surrounded circumferentially by a substantially parallel, cylindrical, outer shield 12. Electrically insulating layers 13b can be located between the ferromagnetic shield 2 and the outer shield 12. The outer shield 12 has a length "Z" as shown in FIG. 2 which is greater than the length "L" of the ferromagnetic shield 2, so that the end surfaces of the ferromagnetic shield 2 are also partially shielded. The length "Z" can be about 30 mm.

The outer shield 12 is preferably made of deep-drawn steel or an iron-nickel alloy. The insulating layers 13b increase the spatial separation between the ferromagnetic shield 2 and the outer shield 12, thereby improving the shielding of the outer shield 12. The insulating layers 13b can have a thickness of about 0.05 mm. The highly permeable but easily saturated ferromagnetic shield 2 is protected, in part, by the outer shield 12 from strong external magnetic fields.

Accordingly, the ferromagnetic shield 2 and the outer shield 12 serve together as a double shield against external magnetic fields. Without the outer shield 12, the ferromagnetic shield can remain unsaturated up to a typical value of an external magnetic field of approximately 50 A/cm. With the double shield, the ferromagnetic shield 2 can remain unsaturated up to a typical value of an external magnetic field of approximately 200 A/cm.

The voltage induced in the coil 3 is proportional to the time derivative of the total magnetic field $\vec{H_a}$ and $\vec{H_b}$. For sinusoidal magnetic fields $\vec{H_a}$ and $\vec{H_b}$, the sum of the magnetic fields $\vec{H_a}+\vec{H_b}$ is substantially equal to $\vec{2H_a}$ because both magnetic fields $\vec{H_a}$ and $\vec{H_b}$ are of about equal magnitude and have about the same direction.

When the magnetic fields $\vec{H_a}$ and $\vec{H_b}$ are not sinusoidal, the output of the coil 3 can be connected to a bipolar input of an integrator (not shown in the drawings). The output signal of the integrator at every instant is proportional to $\vec{2H_a}$. The integrator can be a Miller integrator. A Miller integrator is known in the art and generally includes an operational amplifier which has an output fed back through a capacitor to an inverting input terminal of the operational amplifier. Each of the input terminals of the integrator is connected to the respective inverted and non-inverted input terminals of the operational amplifier within the integrator through a resistor.

The close magnetic coupling between the conductor portions 1a and 1b to the coil 3 is precise and reliable for the arrangement disclosed herein. The ferromagnetic shield 2 reduces the sensitivity of the coil 3 to external magnetic fields and the addition of the outer shield 12 provides additional decoupling of the coil 3 from external magnetic fields.

Figure 3:
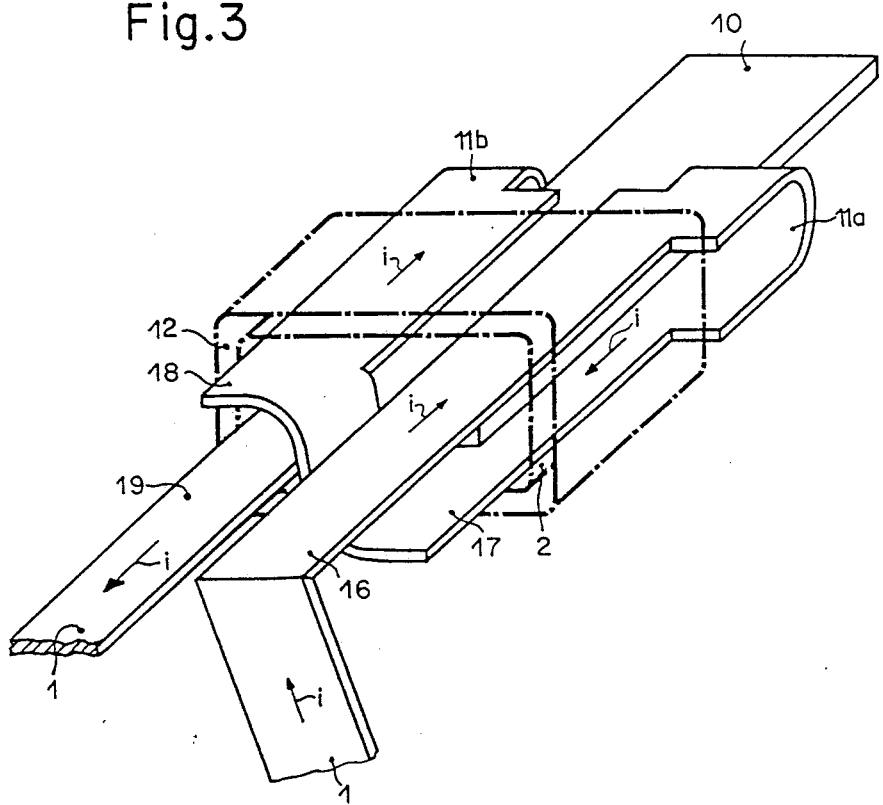
FIG. 3 is a front perspective view of a second embodiment of the invention.
Figure 4:
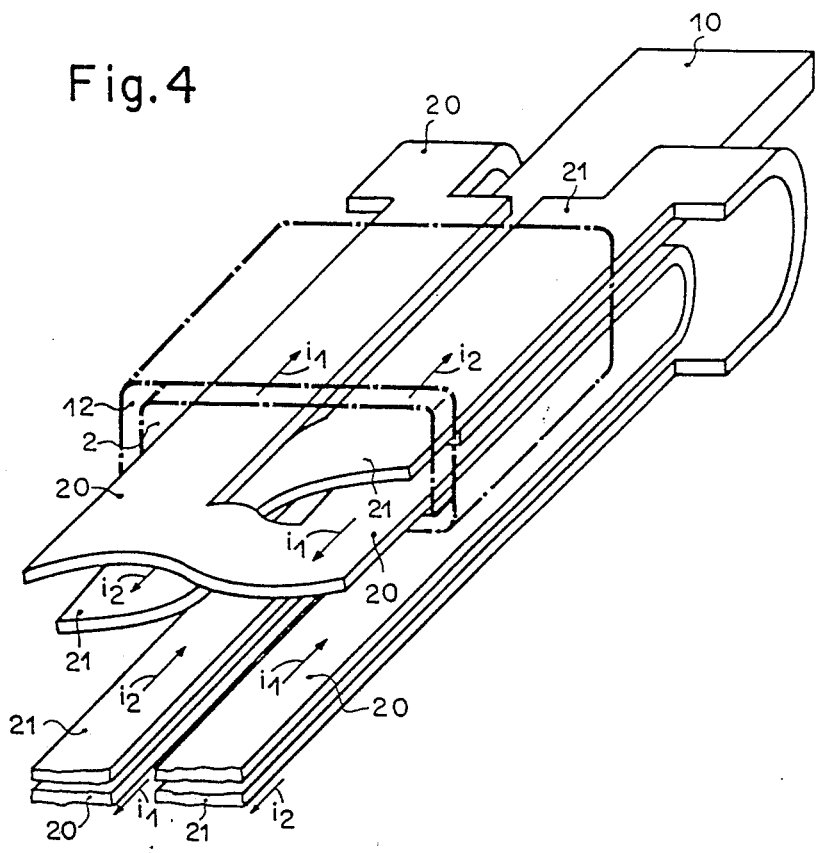
FIG. 4 is a front perspective view of a third embodiment of the invention.

The second and third embodiments shown in FIGS. 3 and 4, respectively, are distinguished from the first embodiment primarily because of the configuration of the electrical conductor 1.

In the arrangement shown in FIG. 3, the electrical conductor 1 forms at least two U-shaped loops 11a and 11b which are positioned side by side and parallel to each other in confronting relationship while being connected electrically in series. The conductor portions 16 and 17 are associated with the U-shaped loop 11a while conductor portions 18 and 19 are associated with the U-shaped loop 11b. The conductor portions 16 and 17 are positioned one above the other and substantially parallel to each other while the conductor portions 18 and 19 are positioned one above the other and parallel to each other. The conductor portions 16 and 18 provide paths for the electrical current i in one direction while the conductor portions 17 and 19 provide paths for the electrical current in the opposite direction. The directions of the flow of the electrical current i are indicated by arrows in FIG. 3.

The housing 10 and coil 3 are positioned between the conductor portions 16 and 18 as well as between the conductor portions 17 and 19 so that all of the conductor portions 16, 17, 18, and 19 are in proximity of the housing 10. The ferromagnetic shielding 2 and, if present, the outer shielding 12 surround the U-shaped loops 11a and 11b radially and are electrically insulated from them. This arrangement makes it possible to excite the transformer system shown in FIG. 3 with half the electrical current used in FIG. 1 without altering the configuration of the ferromagnetic shield 2 and the housing 10. The use of half the electrical current in FIG. 3 produces substantially the same magnetic field as the electrical current in FIG. 1 because of the two U-shaped loops 11a and 11b.

In one arrangement, the U-shaped loops 11a and 11b can be telescoped into each other. In this arrangement, the conductor portions 16 and 18 have electrical current in one direction and are arranged one above the other rather than next to each other as shown in FIG. 3. Similarly, the conductor portions 17 and 19 have the same electrical current in the opposite direction and are arranged one above the each other rather than next to each other. As a result, the conductor portions 16, 17, 18 and 19 in a telescoping arrangement can be nearly twice as wide and half as thick as in a side by side arrangement.

In FIG. 4, the electrical conductor 1 includes electrical conductors 20 and 21 which are parallel to each other at least within the ferromagnetic shield 2 and arranged so that they first cross the ferromagnetic shield in one direction, then cross each other while being electrically insulated from each other and then again cross the ferromagnetic shield 2 in the opposite direction. For this case, the housing 10 and the coil 3 are arranged between the electrical conductors 20 and 21. The electrical conductors 20 and 21 can be fabricated parallel to each other and arranged one above the other as shown in FIG. 4. The outer shield 12 can surround the ferromagnetic shield 2 advantageously as shown in FIG. 4.

The transformer system shown in FIG. 4 can be used in electrical meters suitable for the United States of America and enables the meter to be excited with two independent single-phase currents $i_1$ and $i_2$, each about 200 Amps, without altering the configuration of the housing 10 or the ferromagnetic shield 2. One of the two currents $i_1$ and $i_2$ can be substantially zero in an extreme case. Such an overall design of the conductors 20 and 21 allows the transfer constants of the two currents $i_1$ and $i_2$ to be substantially equal in size.

Finally, the above-described embodiments of the invention are intended to be illustrative only. Numerous alternative embodiments may be devised by those skilled in the art without departing from the spirit and scope of the following claims.

I claim:

1. A transformer system for measuring electrical current comprising:
   an electrical conductor having first and second conductor portions, said first conductor portion conducting an electrical current in one direction and said second conductor portion conducting the electrical current in an opposite direction;
   said first conductor portion producing a magnetic field $\overline{H_a}$ and said second conductor portion producing a magnetic field $\overline{H_b}$;
   a flat coil having a non-ferromagnetic core; said coil having an axis and an axis and an outer circumferential surface;
   said coil being positioned between said first and second conductor portions so that the axis of said coil is substantially parallel to said magnetic fields $\overline{H_a}$ and $\overline{H_b}$;
   the separation between the outer circumferential surface of said coil and said first and second conductor portions being the minimum distance for maximizing the magnetic coupling between said conductor portions and said coil while avoiding voltage breakdown for a predetermined electrical current in said conductor portions; and
   at least one ferromagnetic shield surrounding said first and second conductor portions for shielding said coil from external magnetic fields,
   said ferromagnetic shield being fabricated from sheet metal in the form of a cylinder electrically insulated from said first and second conductor portions,
   the length of said cylinder being greater than the largest dimension of the open ends of said cylinder, and
   a housing made from an electrically insulating material around said coil, said housing having walls which electrically insulate said coil from said first and second conductor portions,
   said housing including a bottom portion which comprises a carrier for said coil.

2. The transformer system of claim 1, wherein said first and second conductor portions have rectangular cross sections and said cylinder has a rectangular cross section.

3. The transformer system as claimed in one of claims 1 and 2 wherein said electrical conductor forms a U-shaped loop which comprises said first and second electrical portions.

4. The transformer system as claimed in one of claims 1 and 2, wherein said electrical conductor forms at least two U-shaped loops which are in side-by-side relationship with each other and are electrically connected in series;
   one of said U-shaped loops comprising said first and second conductor portions and the other U-shaped loop comprising third and fourth conductor portions;
   all of said conductor portions being substantially parallel to each other;
   said first and second conductor portions being arranged one above the other and being operable for conducting an electrical current in opposite directions;
   said third and fourth conductor portions being arranged one above the other and being operable for conducting the electrical current in opposite directions;
   said first and third conductor being arranged in one plane;
   said second and fourth conductor portions being arranged in a second plane;
   said electrical conductor further including a conductive path connecting said second and third conductor portions;
   said coil being positioned between said first and third conductor portions and between said second and fourth conductor portions.

5. The transformer system as claimed in one of the claims 1 and 3 wherein said electrical conductor forms at least two U-shaped loops which are telescoped with respect to each other and are electrically connected in series;
   one of said U-shaped loops comprising said first and second conductor portions and the other U-shaped loop comprising third and fourth conductor portions; all of said conductor portions being arranged parallel to each other;
   said first and third conductor portions being arranged one above the other and operable for conducting an electrical current in one direction while said second and fourth conductor portions being arranged one above the other and operable for conducting the electrical current in the opposite direction;
   said electrical conductor further including a conductive path connecting said second and third conductor portions;
   said coil being positioned between said first and third conductor portions and between said second and fourth conductor portions.

6. The transformer system as claimed in one of claims 1 and 2, wherein said electrical conductor comprises two mutually parallel conductors; said parallel conductors being substantially similar and arranged in side-by-side relationship; each of said parallel conductors forming at least two U-shaped loops which are in side-by-side relationship with each other and are electrically connected in series;
   one of said U-shaped loops comprising said first and second conductor portions and the other U-shaped loop comprising third and fourth conductor portions;
   all of said conductor portions being substantially parallel to each other;
   said first and second conductor portions being arranged one above the other and being operable for conducting an electrical current in opposite directions;

said third and fourth conductor portions being arranged one above the other and being operable for conducting the electrical current in opposite directions;

said electrical conductor further including a conductive path connecting said second and third conductor portions;

said conductor portions of said mutually parallel conductors being interleaved;

said coil being positioned between said parallel conductors.

7. The transformer system of claim 1, wherein said housing is made of a ceramic material.

8. The transformer system as claimed in claim 7, wherein additional electronic elements are located on said carrier.

9. The transformer system of claim 1, wherein said ferromagnetic shield is made of an iron-nickel alloy.

10. The transformer system of claim 1, wherein said ferromagnetic shield is surrounded on its circumferential surface by a substantially parallel outer shield in the shape of a cylinder.

11. The transformer system of claim 10, wherein said outer shield is made of deep-drawn steel.

12. The transformer system of claim 10, wherein said outer shield is made of an iron-nickel alloy.

13. The transformer system as claimed in one of claims 10–12, wherein said ferromagnetic shield and said outer shield are spaced apart from each other.

14. The transformer system as claimed in claim 1 wherein said minimum distance is about 1 mm.

15. The transformer system as claimed in claim 4 wherein said conductive path is a diagonal conductive path.

16. The transformer system of claim 5 wherein all of sad conductor portions are arranged one above another.

17. The transformer system as claimed in claim 6 wherein said first conductor portions of each of said parallel conductors are arranged in one plane, and said fourth conductor portions of each of said parallel conductors are arranged in a second plane.

18. The transformer system as claimed in claim 6 wherein said first and second conductor portions of one of said parallel conductors are disposed between said third and fourth conductor portions of the other of said parallel conductors.

19. The transformer system as claimed in claim 6, wherein said conductive paths of each of said parallel conductors are diagonal conductive paths which cross each other while being electrically insulated from each other.

* * * * *